US008013636B2

(12) United States Patent
Makinwa et al.

(10) Patent No.: US 8,013,636 B2
(45) Date of Patent: Sep. 6, 2011

(54) SYNCHRONOUS PHASE DETECTION CIRCUIT

(75) Inventors: Kofi Afolabi Anthony Makinwa, Delft (NL); Caspar Petrus Laurentius van Vroonhoven, Delft (NL)

(73) Assignee: Stichting voor de Technische Wetenschappen, Utrecht (NL)

( * ) Notice: Subject to any disclaimer, the term of this patent is extended or adjusted under 35 U.S.C. 154(b) by 0 days.

(21) Appl. No.: 12/865,750

(22) PCT Filed: Jan. 30, 2009

(86) PCT No.: PCT/NL2009/050043
§ 371 (c)(1),
(2), (4) Date: Oct. 29, 2010

(87) PCT Pub. No.: WO2009/096787
PCT Pub. Date: Aug. 6, 2009

(65) Prior Publication Data
US 2011/0050283 A1     Mar. 3, 2011

(30) Foreign Application Priority Data
Feb. 1, 2008 (EP) .................................. 08101210

(51) Int. Cl.
*G01R 25/00* (2006.01)
*H03D 13/00* (2006.01)
(52) U.S. Cl. .................. 327/3; 327/2; 327/5; 327/7
(58) Field of Classification Search ............... 327/2, 3, 327/5, 7, 10
See application file for complete search history.

(56) References Cited

U.S. PATENT DOCUMENTS

| 4,520,320 | A | 5/1985 | Potzick et al. |
| 6,121,848 | A * | 9/2000 | Sauer ................... 331/108 C |
| 6,208,215 | B1 * | 3/2001 | Sauer ................... 331/108 C |
| 6,275,553 | B1 | 8/2001 | Esaki |
| 6,281,759 | B1 | 8/2001 | Coffey |
| 6,504,438 | B1 | 1/2003 | Chang et al. |
| 7,920,032 | B2 * | 4/2011 | Makinwa et al. ........... 331/176 |
| 2002/0027459 | A1 | 3/2002 | Fallahi et al. |
| 2005/0237090 | A1 | 10/2005 | Lanier |

FOREIGN PATENT DOCUMENTS
WO     2006/132531     12/2006

OTHER PUBLICATIONS
International Search Report dated Apr. 21, 2009, from corresponding PCT application.

* cited by examiner

*Primary Examiner* — Lincoln Donovan
*Assistant Examiner* — Patrick O'Neill
(74) *Attorney, Agent, or Firm* — Young & Thompson

(57) ABSTRACT

A phase detection circuit determines phase difference between a periodic signal and a reference signal of substantially equal frequency. The circuit includes: a source input receiving the periodic signal; a feedback signal generator providing a feedback signal (PFB) with substantially the same frequency as the reference signal; a phase difference circuit coupled to the source input node and a second signal input node coupled to the feedback signal generator, determining an error signal from phase difference between the periodic signal and PFB; an integrator circuit integrating the error signal into an integration signal; and a digitizing circuit digitizing the integration signal. The feedback signal generator is coupled to the digitizing circuit, providing PFB based on the digitized integration signal, and selecting the phase of PFB from a number of fixed phases. The phase detection circuit generates a time-average of the phase of PFB selected from the plurality of fixed phases.

16 Claims, 4 Drawing Sheets

SYNCHRONOUS PHASE DETECTION CIRCUIT

FIELD OF THE INVENTION

This invention relates to a phase detection circuit for the measurement of phase differences between an input signal obscured by noise and a reference signal. Also the invention relates to a method for method for determining a phase difference between a periodic signal and a reference signal.

BACKGROUND OF THE INVENTION

When driven by a signal at a substantially constant reference frequency, the output signal of an electrothermal filter will experience a certain phase-shift.

WO/2006/132531 describes an oscillator based on thermal diffusion, which comprises a frequency locked loop which is coupled to an electrothermal filter and allows measurement of the absolute temperature T of the electrothermal filter. The frequency of the oscillator is inversely proportional to $1/T^{1.8}$. Using this oscillator it is observed that the phase shift between the driving signal of the electrothermal filter and the phase of the periodic signal at the output of the filter is a nearly linear function of temperature.

To avoid significant self-heating in the substrate in which the electrothermal filter is realized, the filter's power dissipation must be minimized. As a result, the filter's output will be small and will be obscured by noise. There is therefore a need for a phase detection circuit that can output a signal which is an accurate measure of the phase difference between a signal obscured by noise and a reference signal with the same frequency.

U.S. Pat. No. 4,520,320 describes a phase detection circuit for determining the phase difference between an input signal obscured by noise and a reference signal, where both signals are at the same frequency. This circuit consists of a chopper (a polarity reversing switch) embedded in a feedback loop that also consists of an integrator and a voltage-controlled phase shifter. The input signal is applied to the input of the chopper, while the control input of the chopper is coupled to the output of a voltage-controlled phase shifter. The input of the phase-shifter is a reference signal at the same frequency as the input signal. The output of the chopper is applied to an integrator which provides the control voltage to the voltage-controlled phase-shifter. The feedback loop will settle when the average input of the integrator is zero, which corresponds to a 90° phase difference between the input signal and the output of the phase-shifter. A further output of the voltage-controlled phase shifter is arranged to be 90° out of phase with the output supplied to the chopper and is thus in phase with the input signal obscured by noise.

The phase detection circuit of the prior art does not provide an output signal that is an accurate measure of the phase difference between the input and reference signals. Although the control voltage applied to the voltage-controlled phase shifter is related to this phase difference, their relationship is ill-defined, since the phase-shifter is a complex analog system that is sensitive to the tolerances and linearity of its constituent parts.

Another drawback of phase detection circuit of the prior art is that it is sensitive to any offset present at the output of the chopper. This offset may be caused by the asymmetric switching spikes produced by a practical chopper.

A further source of error arises if the duty-cycle of the signal applied to the control input of the chopper is not exactly 50%. In a practical implementation, this will occur if the rise and fall times of this signal are mismatched. The phase detection circuit will then be sensitive to even harmonics of the reference frequency present in the input signal. In particular, it will be sensitive to the DC level of the input signal. Any such DC level will then lead to a change in the average level at the output of the chopper, and so to an error in the detected phase difference.

US patent application 2002/027459 discloses a method and system for producing frequency multiplication/division by any non-integer output signal frequency relative to a reference signal frequency of a PLL, while simultaneously maintaining low jitter.

SUMMARY OF THE INVENTION

It is an object of the present invention to provide a circuit which overcomes the disadvantages from the prior art and generates a signal which is a more accurate measure of the phase difference between an input signal obscured by noise and a reference signal.

It is an additional object of the present invention to determine the temperature of a substrate by accurately measuring the phase-shift of an electrothermal filter embedded in the same substrate.

According to one embodiment, the present invention relates to a phase detection circuit arranged as sigma-delta modulator for determining a phase difference between a periodic signal and a reference signal, the periodic signal and the reference signal having a substantially equal frequency, comprising:

a source input node configured to receive the periodic signal whose phase relationship with respect to the reference signal is to be determined;

a feedback signal generator configured to provide a feedback signal, the feedback signal and reference signal having substantially the same frequency;

a phase difference circuit having a first signal input node coupled to the source input node and a second signal input node coupled to the feedback signal generator, and configured to receive the feedback signal, wherein the phase difference circuit is configured to determine an error signal that is a function of the phase difference between the periodic signal and the feedback signal and to provide the error signal at an output node;

an integrator circuit coupled to the output node of the phase difference circuit, configured to receive the error signal and configured to integrate the error signal to provide an integration signal;

a digitizing circuit coupled to the integration circuit, configured to receive the integration signal and configured to digitize the integration signal to provide a digitized integration signal;

wherein the feedback signal generator is coupled to the digitizing circuit;

wherein the feedback signal generator is configured to provide the feedback signal based on the digitized integration signal from the digitizing circuit; and wherein the feedback signal generator is configured to select the phase of the feedback signal with respect to the reference signal from a plurality of fixed phases, wherein the phase detection circuit is arranged for generating a time-average of the phase of the feedback signal as selected from the plurality of fixed phases.

According to another embodiment, the present invention relates to the phase detection circuit as described above, wherein the digitizing circuit comprises an N-level analog-to-digital converter having N output values which is configured to provide a digital value to the feedback signal generator that enables the feedback signal generator to select the phase of the feedback signal with respect to the reference signal from a plurality of fixed phases; and wherein the number of fixed phases is less than or equal to N.

According to yet another embodiment, the present invention relates to the phase detection circuit as described above, wherein the digitizing circuit includes a 1-bit analog-to-digital converter or comparator device configured to provide a binary value that enables the feedback signal generator to select the phase of the feedback signal from one of two fixed phases.

According to a further embodiment, the present invention relates to the phase detection circuit as described above, wherein the phase difference circuit comprises a multiplication circuit; wherein the multiplication circuit has a first signal input node coupled to the source input node and a second input node coupled to the feedback generator; and wherein the multiplication circuit is configured to provide a multiplication signal which is substantially equal to the product of the periodic signal and the feedback signal.

According to yet another embodiment, the present invention relates to the phase detection circuit as described above, wherein the multiplication circuit comprises either a feedback chopper or a polarity-reversing switch.

In an embodiment, the phase detection circuit as described above, comprises a first chopper, coupled to the phase difference circuit and to the integration circuit, configured to receive the error signal from the phase difference circuit and a chopping signal having a first chopping frequency, and configured to provide a chopped error signal to the integration circuit;
a second chopper coupled to the source input node, configured to receive the periodic signal and a chopping signal having a second chopping frequency, and configured to provide a chopped periodic signal to the source input node.

According to a further embodiment, the present invention relates to the phase detection circuit as described above, wherein a source circuit, coupled to the source input node, is configured to provide the periodic signal.

According to another embodiment, the present invention relates to the phase detection circuit as described above, wherein the source circuit comprises an electrothermal filter; and wherein the electrothermal filter is configured to be driven by a heat power signal as driving signal, the heat power signal having a frequency substantially equal to the reference signal.

In yet another embodiment, the phase detection circuit as described above, comprises a first chopper, coupled to the phase difference circuit and to the integration circuit, configured to receive the error signal from the phase difference circuit and a chopping signal having a first chopping frequency, and configured to provide a chopped error signal to the integration circuit;
a second chopper coupled to an input node of the source device, the second chopper configured to receive the driving signal and a chopping signal having a second chopping frequency, and configured to provide a chopped driving signal to the input node of the source device.

According to an embodiment, the present invention relates to the phase detection circuit as described above, wherein the first chopping frequency and the second chopping frequency are substantially equal.

In an embodiment, the phase detection circuit as described above, comprises a polarity switching circuit, an input of the second chopper coupled to an output of the polarity switching circuit, the polarity switching circuit configured for:

receiving on an input the driving signal,
periodically inverting a polarity of a voltage or current of the received driving signal, and
outputting the periodically polarity inverted driving signal to the input of the second chopper.

According to a still further embodiment, the present invention relates to the phase detection circuit as described above, wherein a range of phases of the plurality of fixed phases extends over a phase angle corresponding to a desired temperature range corresponding to a relationship between the phase of the periodic signal and a temperature experienced by the electrothermal filter.

According to yet another embodiment, the present invention relates to the phase detection circuit as described above, wherein a first fixed phase of the two fixed phases is shifted by $-45°$ relative to a phase of the driving signal and the second fixed phase of the two fixed phases is shifted by $+45°$ relative to the phase of the driving signal.

According to a still further embodiment, the present invention relates to the phase detection circuit as described above, wherein the periodic signal and the reference signal are in the voltage domain.

According to another embodiment, the present invention relates to the phase detection circuit as described above, wherein the periodic signal and the reference signal are in the current domain.

According to a still further embodiment, the present invention relates to a method for phase detection for determining a phase difference between a periodic signal and a reference signal, the periodic signal and the reference signal having a substantially equal frequency, comprising:

receiving the periodic signal whose phase relationship with respect to the reference phase signal is to be determined;
subtracting the phases of the periodic signal and a feedback signal to obtain an error signal;
integrating the error signal as an integration signal;
digitizing the integration signal as a digitized integration signal;
generating a phase of a feedback signal based on the digitized integration signal, wherein the phase of the feedback signal is selected from a plurality of fixed phases;
generating a time-average of the phase of the feedback signal as selected phase from the plurality of fixed phases and
subsequently, providing the feedback signal having the selected phase, for the subtraction of the phase of the periodic signal and the feedback signal to obtain the error signal.

BRIEF DESCRIPTION OF DRAWINGS

The invention will be explained in more detail below with reference to a few drawings in which illustrative embodiments thereof are shown. They are intended exclusively for illustrative purposes and not to restrict the inventive concept, which is defined by the claims.

DESCRIPTION OF EMBODIMENTS

For the purpose of the teaching of the invention, embodiments of the method and devices of the invention are described below.

Figure 1:
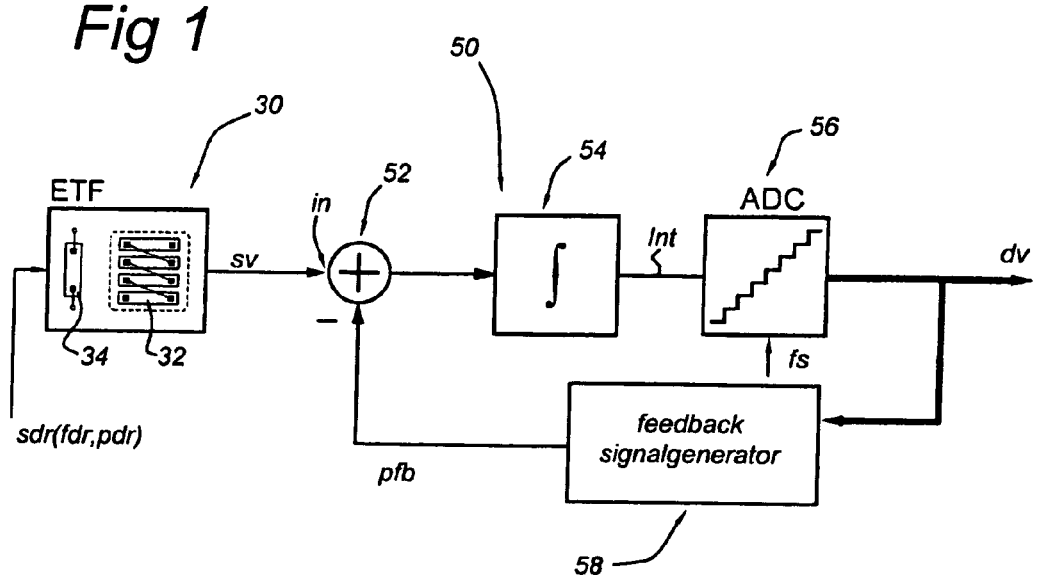
FIG. 1 shows schematically a first embodiment of the synchronous phase detection circuit in accordance with the present invention.

FIG. 1 shows schematically a first embodiment of a synchronous phase detection circuit in accordance with the present invention.

In the present invention the synchronous phase detection circuit (synchronous phase detector) is based on the idea that the source circuit is driven at a constant frequency.

In this embodiment, the synchronous phase detection circuit 50 according to the present invention comprises a phase difference circuit 52, an integrator circuit 54, a digitizing circuit 56 and a feedback signal generator 58.

An input node of the source circuit 30 is coupled to a driver (not shown) which provides a driving signal sdr as a reference signal with driving frequency fdr and a reference phase pdr.

The source circuit 30 is arranged for producing a response signal responsive to the driving signal sdr, which is represented by a periodic signal sv with frequency f0 and phase p0. Typically, the frequency f0 of the periodic signal sv is equal to the driving frequency fdr.

In this embodiment, the digitizing circuit 56 is embodied as an n-level analog-digital converter with n output levels. The feedback signal generator 58 is embodied as an n-level discrete phase generator which is arranged for generating a feedback signal pfb with one phase selected from a number n of fixed phases ps1 ... psn.

An output node of the source circuit 30 is coupled with a first input node (source input node in) of the phase difference circuit 52 for providing the periodic signal sv with frequency f0 and phase p0 to the phase difference circuit 52.

A second input node of the phase difference circuit 52 is coupled to an output node of the n-level discrete phase generator 58 for receiving the feedback signal pfb with frequency f0 and a feedback phase selected from a number n of fixed phases ps1 ... psn.

The source circuit is for example an electrothermal filter. In that case, the phase p0 is a measure of the temperature of the electrothermal filter.

The electrothermal filter may comprise a thermopile 32 and a heater arrangement 34 on a semiconductor substrate. The thermopile 32 and heater arrangement 34 form a thermal RC network. The heater arrangement receives an oscillating signal during use, so as to generate heat pulses. The thermopile is located at some distance from the heater arrangement and is arranged for sensing the heat pulses generated by the heater arrangement that diffuse through the substrate. Instead of the thermopile any type of suitable temperature sensor may be used. For example, an array of transistors may also be employed for detecting the thermal signal generated by the heater arrangement.

In the case that the source circuit 30 is an electrothermal filter, it can be shown that the phase p0 of the periodic signal sv is proportional to the absolute temperature T according to:

$$p0 = T^{0.9} \quad [\text{eq. 1}]$$

Depending on the actual implementation, i.e., the desired temperature range that could be measured, the range of the fixed phases ps1 ... psn must be chosen to extend over a phase angle that corresponds with the desired temperature range. For a given electrothermal filter for example, the phase angle may be chosen to be at least 40° in order to cover the military temperature range: −55° C. to 125° C. In other implementations the phase angle may be chosen larger or smaller depending on the desired temperature range.

The feedback signal pfb may be a square-wave periodic signal, but may be of another periodic type such as sine-wave, triangular wave, sawtooth, etc.

The phase difference circuit produces an error signal sum from the periodic signal sv and the feedback signal pfb. The error signal sum will be substantially zero when the phase p0 of the periodic signal sv is equal to the feedback phase of feedback signal pfb.

An output node of the phase difference circuit 52 is coupled to an input node of the integrator circuit 54 for providing the error signal sum to the integrator circuit.

Integrator circuit 54 integrates the error signal sum over time as integration signal int.

An output node of the integrator circuit 54 is coupled to an n-level analog-digital converter 56 for providing the integration signal int to the n-level analog-digital converter.

The n-level analog-digital converter 56 converts the analog value of the integration signal int to a digital output signal dv, having one of n output levels.

An output node of the n-level analog-digital converter 56 is coupled to an input node of the n-level discrete phase generator 58.

The n-level discrete phase generator 58 is arranged for receiving the digital output signal dv of the n-level analog-digital converter 56 and for generating a signal with frequency f0 and one fixed phase value of a number of fixed phases ps1 ... psn as the feedback phase of the feedback signal pfb, the one fixed phase value being selected as a function of a value of the received digital output signal dv.

The number of fixed phases must be at least two, and is typically equal to the number n of output levels of the n-level analog-digital converter 56.

Figure 2:
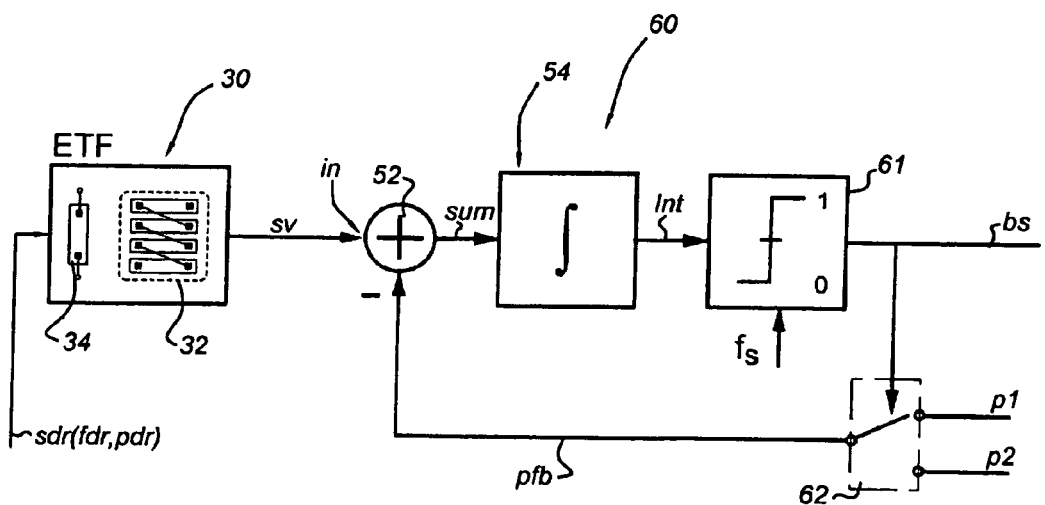
FIG. 2 shows schematically a second embodiment of the synchronous phase detection circuit in accordance with the present invention.

The embodiment of the synchronous phase detection circuit in FIG. 2 can be regarded to function as a sigma-delta modulator. By providing a sufficiently high sampling frequency fs to the n-level analog-digital converter 56, its quantization errors can be made sufficiently small in a finite signal bandwidth near DC. In this case, the average value of the digital signal dv will be an accurate measure of the input phase p0.

FIG. 2 shows schematically a second embodiment of the synchronous phase detection circuit in accordance with the present invention.

In FIG. 2, entities with the same reference number as shown in the preceding figures refer to the corresponding entities in the preceding figures. In the second embodiment, the synchronous phase detection circuit 60 according to the present invention comprises a phase difference circuit 52, an integrator circuit 54, a 1-bit analog-digital converter 61 and a binary (two-level) phase generator 62.

The second embodiment 60 differs from the first embodiment in that the n-level analog-digital converter 56 is replaced by a 1-bit analog-digital converter or comparator 61, and the n-level discrete phase generator 58 is replaced by the binary phase generator 62. The other entities are identical or equivalent to the corresponding entities in the preceding figures and will not described here in detail.

The error signal sum is substantially zero when the feedback phase of the feedback signal pfb and the phase p0 of the periodic signal sv from the source circuit 30 are equal. The integrated signal int as determined by the integrator circuit 54 will be a time-averaged value.

The 1-bit analog-digital converter or comparator 61 can be in either of two states (i.e. either zero or one) as a function of the value of the integration signal int. Thus, the 1-bit analog-digital converter or comparator 61 generates, on an output node, a bitstream bs with a frequency equal to the applied sampling frequency fs. The bit value of bits in the bitstream bs is either zero or one.

The output node of the 1-bit analog-digital converter or comparator 61 is coupled to a selecting input node of the binary phase generator 62. The binary phase generator 62 can be regarded as a switching element which is arranged to receive at a first signal input node a first fixed phase signal with a first phase p1 and at a second input node a second fixed phase signal with a second phase p2.

The first and second fixed phase signals each have a frequency equal to the driving frequency fdr of the driving signal sdr.

Based on the temporal value of the bitstream bs on the selecting input node, the binary phase generator 62 selects as a binary output signal either the first fixed phase signal with first phase p1 (for example at bit value zero) or the second fixed phase signal and second phase p2 (for example at bit value one).

An output node of the binary phase generator 62 is coupled to the phase difference circuit 52 for providing the binary output signal as feedback signal pfb to the phase summation circuit. The feedback signal pfb has either the first phase p1 or the second phase p2, depending on the temporal bit value of the bit stream bs.

In an embodiment, the first and second phase p1, p2 exhibit a phase difference of 90°.

Thus, averaged over time, the feedback signal pfb will substantially have a feedback phase substantially equal to the phase p0 of the periodic signal sv from the source circuit 30. In consequence, the average value of the bitstream bs will be an accurate measure of the input phase p0

In this manner, the synchronous phase detection circuit is arranged for generating a time-average of the first and second phase that corresponds with the phase p0 of the periodic signal sv generated by the source circuit 30.

Figure 3:
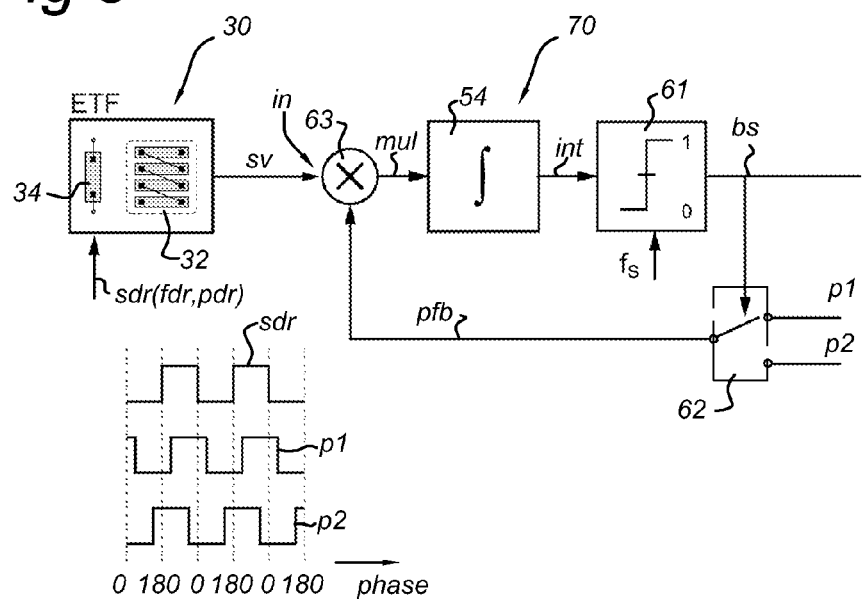
FIG. 3 shows schematically a third embodiment of the synchronous phase detection circuit in accordance with the present invention.

FIG. 3 shows schematically a third embodiment of the synchronous phase detection circuit in accordance with the present invention.

In FIG. 3 entities with the same reference number as shown in the preceding figures refer to the corresponding entities in the preceding figures. In the third embodiment, the synchronous phase detection circuit 70 according to the present invention comprises a multiplication circuit 63, an integrator circuit 54, a 1-bit analog-digital converter 61 and a binary phase generator 62.

The third embodiment 70 differs from the second embodiment in that the phase difference circuit is replaced by a multiplication circuit. The other entities are identical or equivalent to the corresponding entities in the preceding figures and will not described here in detail.

An output node of the source circuit 30 is coupled to a first input node of the multiplication circuit 63 for providing the periodic signal sv with frequency f0 and phase p0 to the multiplication circuit 63.

A second input node of the multiplication circuit 63 is coupled to an output node of the binary phase generator 62 for receiving a feedback signal pfb with frequency f0 (fdr) and either the first phase p1 or the second phase p2.

An output node of the multiplication circuit 63 is coupled to the input node of the integrator circuit 54 for providing a multiplication signal mul to the integrator circuit.

It will be appreciated that a direct current (DC) component of the multiplication signal is proportional to the cosine of a phase difference of p0 and pfb. Thus, for a value of the phase difference of p0 and pfb close to 90°, the DC component will in a first approximation be a linear function of small changes in this phase difference. For this reason, the multiplication circuit 63 may be used here for determining the difference between the phase of the periodic signal sv and the feedback signal pfb, when this phase difference is close to 90°.

In this embodiment, the first and second phase p1, p2 exhibit a phase difference (phase angle) of 90°. Moreover, the first phase p1 is shifted over −45° relative to the phase pdr of the driving signal sdr and the second phase p2 is shifted over +45° relative to the phase pdr of the driving signal sdr. See the inset of FIG. 3.

As known to persons skilled in the art, the combination of the multiplication circuit 63 and the integrator circuit 54 make up a synchronous demodulator, which has a characteristic to reduce the bandwidth of the input signals, which advantageously can reduce noise on the input signals.

Figure 4:
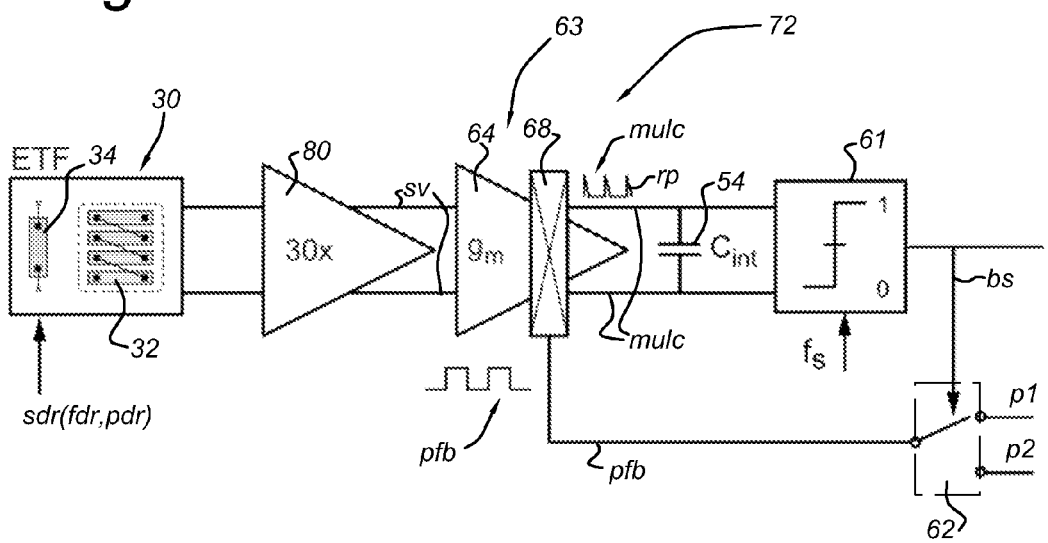
FIG. 4 shows schematically a fourth embodiment of the synchronous phase detection circuit in accordance with the present invention.

FIG. 4 shows schematically a fourth embodiment of the synchronous phase detection circuit in accordance with the present invention.

In FIG. 4 entities with the same reference number as shown in the preceding figures refer to the corresponding entities in the preceding figures. In the fourth embodiment, synchronous phase detection circuit 72 according to the present invention comprises a multiplication circuit 63, an integrator circuit 54, a 1-bit analog-digital converter 61, a binary phase generator 62.

The multiplication circuit 63 comprises a transconductor 64 and a feedback chopper 68. The transconductor is coupled to the feedback chopper 68. Alternatively, the feedback chopper may be embodied as a polarity-reversing switch.

In the fourth embodiment, the integration is done in the current domain. This is advantageous since in integrated circuits integration of current signals may be easily implemented with capacitors.

The output node of the source circuit 30 is coupled to the transconductor 64, which is arranged for conversion of a voltage-domain periodic signal sv to an equivalent current-domain periodic signal scv.

Optionally, the source circuit is coupled to the transconductor 64 through an amplifying device 80 which is arranged for amplifying the periodic signal before input to the transconductor 64.

The transconductor 64 is coupled to the first input node of the feedback chopper 68 for providing the periodic current signal scv to the chopper 63. The second control input node of the feedback chopper 68 is coupled to the binary phase generator 62 for receiving the feedback signal pfb with fixed frequency fdr and variable phase p1, p2 as controlled by the bitstream bs. The feedback chopper 68 is arranged for generating a current based multiplication signal mulc.

It will be appreciated that the combination 63 of the transconductor 64 and the feedback chopper 68 provides a substantially multiplied current to the integrator circuit and can be regarded as a multiplication circuit i.e. a device that multiplies a signal by a square wave signal such as the feedback signal pfb.

The output node of the feedback chopper 68 is coupled to an input node of the integrator circuit 54. In this case the integrator circuit 54 can be identical to a capacitor C_int.

The output node of the integrator circuit 54 is coupled to the input node of the 1-bit analog-digital converter or comparator 61 for providing a current based integration signal intc to the 1-bit analog-digital converter or comparator.

The arrangement and function of the 1-bit analog-digital converter or comparator 61 and the binary phase generator 62 are identical or equivalent to those as described with reference to the second and third embodiment, and will not be discussed here in more detail.

Figure 5:
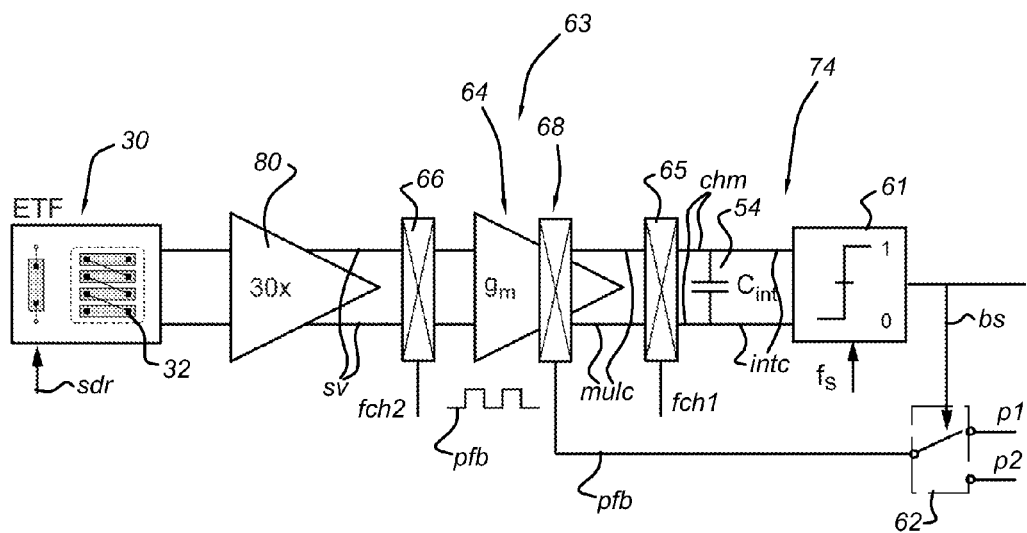
FIG. 5 shows schematically a fifth embodiment of the synchronous phase detection circuit in accordance with the present invention.

FIG. 5 shows schematically a fifth embodiment of the synchronous phase detection circuit in accordance with the present invention.

In FIG. 5 entities with the same reference number as shown in the preceding figures refer to the corresponding entities in the preceding figures. In the fifth embodiment, synchronous phase detection circuit 74 according to the present invention comprises a multiplication circuit 63, an integrator circuit 54, a 1-bit analog-digital converter 61, a binary phase generator 62, a first chopper 65 and a second chopper 66. The multiplication circuit 63 comprises the transconductor 64 coupled to the feedback chopper 68.

Due to the switching spikes rp produced by a practical chopper in the synchronous phase detector described with reference to FIG. 4, the output of the first chopper 68 may contain a net DC error component superposed on the current based multiplication signal mulc.

The synchronous phase detector according to the fifth embodiment, employs a further signal processing to reduce this DC error component. This is achieved by a nested chopping operation in which the driving signal sdr is chopped at a relatively low frequency (in comparison to the driving frequency fdr of the driving signal sdr) and the current based multiplication signal mulc is chopped at the same frequency. This will be illustrated in more detail below.

The output node of the source circuit 30 is coupled to the transconductor 64, which is arranged for conversion of the voltage-domain periodic signal sv to an equivalent current-domain equivalent periodic current signal scv.

Optionally, the source circuit is coupled to the transconductor 64 through an amplifying device 80 which is arranged for amplifying the periodic signal before input to the transconductor 64.

The transconductor 64 is coupled to the first input node of the feedback chopper 68 for providing the periodic current signal scv to the feedback chopper 68. The second input node of the feedback chopper 68 is coupled to the binary phase generator 62 for receiving the feedback signal pfb with fixed frequency fdr and variable phase p1, p2 as controlled by the bitstream bs. The feedback chopper 68 is arranged for generating a current based multiplication signal mulc which comprises a train of switching spikes (see inset in FIG. 6) with a frequency equal to the frequency f0 of the variable (current) signal sv (scv) and a net DC component.

The output node of the feedback chopper 68 is coupled to an input node of the first chopper 65 for providing the current based multiplication signal mulc to the first chopper 65. The first chopper 65 has a second input node for receiving a chopping signal with a first chopping frequency fch1. An output node of the first chopper 65 is coupled to an input node of the integrator circuit 54. In this case the integrator circuit 54 can be identical to a capacitor C_int.

The first chopper 65 is arranged to produce a chopped multiplication signal chm from the current based multiplication signal mulc and output the chopped multiplication signal chm to the integrator circuit 54. The chopping frequency fch1 is selected as a low frequency in comparison with the frequency fdr of the driving signal sdr.

In this manner, the DC error component produced by the feedback chopper 68 will have an average value of zero. The frequency of the switching spikes produced by first chopper 65 is much lower than the frequency fch1. As a result the net DC error component produced by its switching spikes is proportionally lower. For example, the frequency of the driving signal sdr may be in the order of ones to hundreds of kHz, say say between about 1 and about 250 kHz, while the chopping frequency is in the order of ones to tens of Hz, say between about 2 and about 25 Hz.

The output node of the integrator circuit 54 is coupled to the input node of the 1-bit analog-digital converter or comparator 61 for providing a current based integration signal intc to the 1-bit analog-digital converter or comparator.

The second chopper 66 is located between the electrothermal filter 30 and the feedback chopper 68. The second chopper 66 is arranged for producing a chopped periodic signal chsv from the periodic signal sv by applying a second chopping frequency fch2 and outputting the chopped periodic signal chsv to the input node of the feedback chopper 68.

In an embodiment, the first chopping frequency fch1 is substantially equal to the second chopping frequency fch2. The application of the first and second chopper in the synchronous phase detection circuit and before the feedback chopper 68 respectively, advantageously reduces the frequency of their switching spikes to the level of the chopping frequency fch1, and hence reduces their associated DC component significantly.

By the arrangement of the feedback chopper 68 between the first chopper 65 and the second chopper 66 any offset associated with the operation of the feedback chopper 68 can be reduced to substantially zero.

The duty cycle of the chopping signals applied to the first and second chopper 65, 66, respectively, must be substantially equal to 50%.

In a preferred embodiment, the duty cycle of the chopping signal applied to the feedback chopper 68 is substantially equal to 50%.

Figure 6:
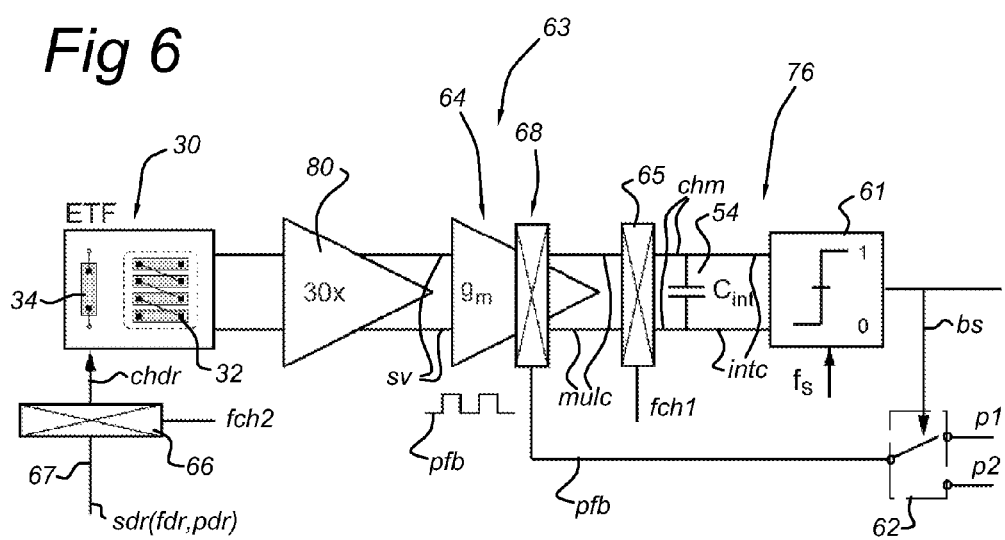
FIG. 6 shows schematically a sixth embodiment of the synchronous phase detection circuit in accordance with the present invention.

FIG. 6 shows schematically a sixth embodiment of the synchronous phase detection circuit in accordance with the present invention.

In FIG. 6 entities with the same reference number as shown in the preceding figures refer to the corresponding entities in the preceding figures. In the sixth embodiment, synchronous phase detection circuit 76 according to the present invention comprises a multiplication circuit 63, an integrator circuit 54, a 1-bit analog-digital converter 61, a binary phase generator 62, a transconductor 64, a first chopper 65 and a second chopper 66.

The multiplication circuit 63 comprises a transconductor 64 coupled to a feedback chopper 68.

The sixth embodiment 76 differs from the fifth embodiment 74 in that in the sixth embodiment, the second chopper 66 is located in the driving line 67 at the input of the electrothermal filter 30. The first chopper 65 is located in the same position as in the fifth embodiment, between the feedback chopper 68 and the integrator circuit 54.

The second chopper 66 is located in the driving line 67 that is coupled to the input node of the source circuit 30. The second chopper 66 is arranged for producing a chopped driving signal chdr from the driving signal sdr by applying a second chopping frequency fch2 and output the chopped driving signal chdr to the input node of the source circuit 30.

As will be appreciated by the skilled person, the cooperation of the first and second choppers 65, 66 results in a reduction of any offset introduced by the operation of feedback chopper 68.

Figure 7:
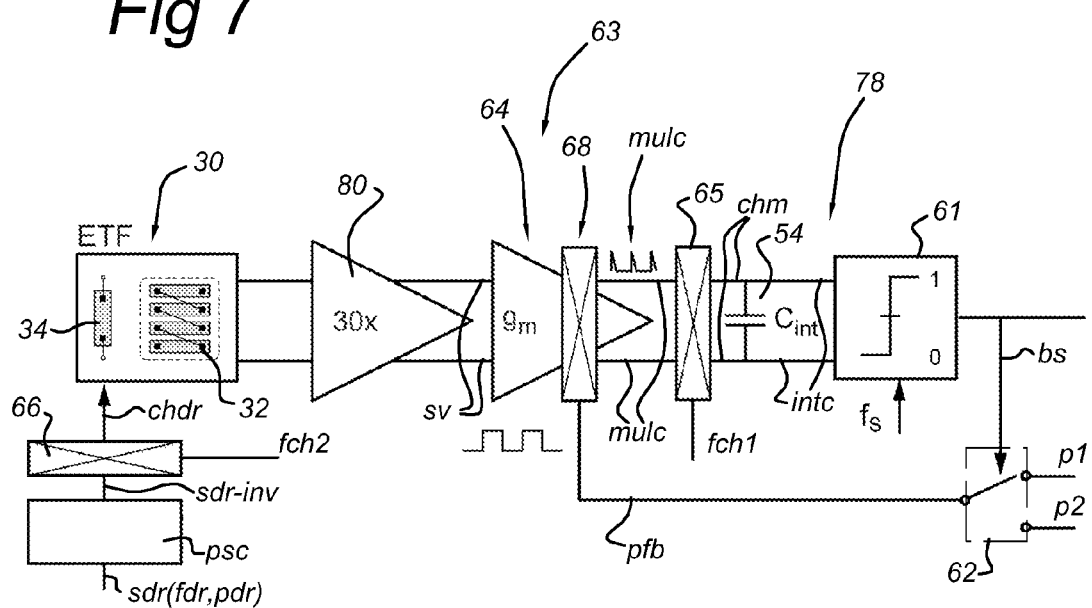
FIG. 7 shows schematically a seventh embodiment of the synchronous phase detection circuit in accordance with the present invention.

FIG. 7 shows schematically a seventh embodiment of the synchronous phase detection circuit in accordance with the present invention.

In FIG. 7 entities with the same reference number as shown in the preceding figures refer to the corresponding entities in the preceding figures. In the seventh embodiment, synchronous phase detection circuit 78 according to the present invention comprises a multiplication circuit 63, an integrator circuit 54, a 1-bit analog-digital converter 61, a binary phase generator 62, a transconductor 64, a first chopper 65, a second chopper 66 and a polarity switching circuit psc.

The multiplication circuit 63 comprises a transconductor 64 coupled to a feedback chopper 68. The seventh embodiment 78 differs from the sixth embodiment in that in the seventh embodiment, an input of the second chopper 66 in driving line 67 is coupled to a polarity switching circuit psc. All other entities are arranged as discussed with reference with FIG. 6 and will not be described here.

The polarity switching circuit psc is arranged for receiving on an input the driving signal sdr, for periodically inverting the polarity of the voltage or the current of the received driving signal sdr, and for outputting the periodically polarity-inverted driving signal sdr_inv to the input of the second chopper 66.

The function of the polarity switching circuit is to provide a driving signal to the heater arrangement 34 in such a way, that electrical cross-talk generated in the thermopile 32 by the driving signal can be compensated for, without affecting the heat power provided to the heater arrangement of the electrothermal filter 30.

This can be done for example by implementing the heating arrangement of the electrothermal filter as a resistor. Since the generated heat in a resistor is proportional to the square of the driving voltage or current, changing the polarity of the driving signal will not change the heat power provided to the electrothermal filter.

The driving signal sdr may be a square-wave signal that by capacitive coupling generates spikes in the periodic signal sv produced by the electrothermal filter. The spikes are in phase with the periodic signal sv and will be demodulated as ripple rp by the phase difference circuit 52; 63.

By inverting the voltage or current of the square-wave (changing the polarity of the voltage or current of the driving signal), the sign of the spikes in the periodic signal sv and of the ripple after demodulation will be reversed. As a result, a time average of the demodulated spikes or ripple can be reduced to substantially zero. At the same time the heat power provided to the electrothermal filter is not affected by the polarity inversion of the voltage or current.

Figure 8:
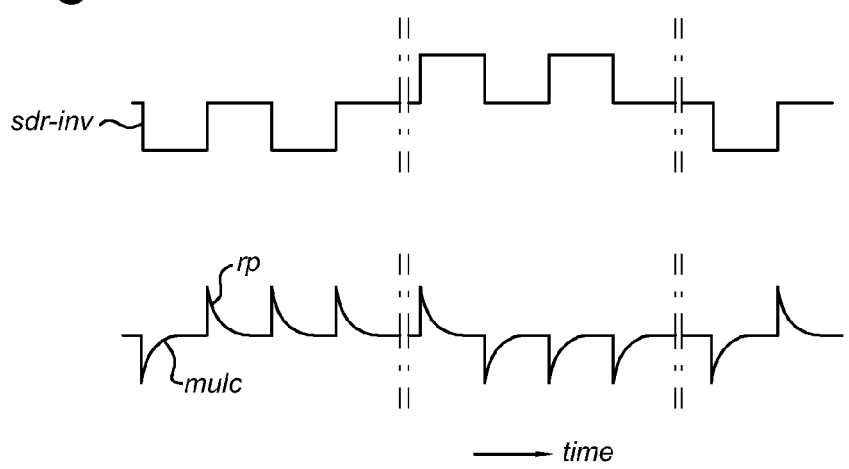
FIG. 8 illustrates the relation between the driving signal and the demodulated spikes or rippled signal when periodic polarity inversion is applied.

FIG. 8 illustrates the relation between the driving signal sdr and the demodulated spikes or rippled signal mule as a function of time when periodic polarity inversion is applied.

The driving signal sdr is periodically inverted by the polarity switching circuit psc into a periodically inverted driving signal sdr-inv Above, the source circuit 30 is described by the example of an electrothermal filter. It is noted that the source circuit 30 may be any sensor or sensing circuit in which an output signal is a periodic signal sv with a phase p0 which has a phase difference relative to a phase pdr of an input signal sdr applied to an input of the source circuit. The phase difference may be generated by any conceivable physical parameter that can be sensed by the source device.

A further example of a source circuit 30 is a bulk acoustic wave device.

It will be apparent to the person skilled in the art that other alternative and equivalent embodiments of the invention can be conceived and reduced to practice without departing form the spirit of the invention, the scope of the invention limited only by the appended claims.

The invention claimed is:

1. Circuit of an electrothermal filter coupled to a phase detection circuit (50; 60; 70; 72; 74; 76; 78) arranged to function as a sigma-delta modulator, for determining a phase difference between a response signal (sv) of the electrothermal filter and a driving signal (sdr) of the electrothermal filter, the response signal and the driving signal having an equal frequency (f0;fdr), comprising:
   an electrothermal filter;
   a source input node (in) coupled to the electrothermal filter and configured to receive the response signal whose phase relationship with respect to the driving signal is to be determined;
   a feedback signal generator (58; 62) configured to provide a feedback signal (pfb), the feedback signal being generated with a frequency (f0) such that the feedback signal and the driving signal have the same frequency;
   a phase difference circuit (52) having a first signal input node coupled to the source input node (in) and a second signal input node coupled to the feedback signal generator (58; 62), and configured to receive the feedback signal,
      wherein the phase difference circuit is configured to determine an error signal (sum; mul; mulc; chm) that is a function of the phase difference between the response signal and the feedback signal and to provide the error signal at an output node;
   an integrator circuit (54) coupled to the output node of the phase difference circuit, configured to receive the error signal and configured to integrate the error signal to provide an integration signal (int); characterized by
   a digitizing circuit (56; 61) being provided with a sampling signal (fs) and coupled to the integration circuit, configured to receive the integration signal and configured to digitize the integration signal to provide a digitized integration signal (dv; bs);
      wherein the feedback signal generator (58; 62) is coupled to the digitizing circuit (56; 61);
      wherein the feedback signal generator is configured to provide the feedback signal based on the digitized integration signal from the digitizing circuit and to select the phase of the feedback signal from a plurality of fixed phases (ps1 . . . psn;p1, p2).

2. The circuit according to claim 1, wherein the phase detection circuit is arranged for generating a time-average of the phase of the feedback signal as selected from the plurality of fixed phases.

3. The circuit according to claim 1, wherein the digitizing circuit (56) comprises an N-level analog-to-digital converter having N output values which is configured to provide a digital value to the feedback signal generator (58) that enables the feedback signal generator to select the phase of the feedback signal from a plurality of fixed phases; and
   wherein the number of fixed phases is less than or equal to N.

4. The circuit according to claim 1, wherein the digitizing circuit (61) includes a 1-bit analog-to-digital converter or comparator device configured to provide a binary value that enables the feedback signal generator (62) to select the phase of the feedback signal from one of two fixed phases (p1, p2).

5. The circuit according to claim 4, wherein a first fixed phase of the two fixed phases is shifted by −45° relative to a phase of the driving signal and the second fixed phase of the two fixed phases is shifted by +45° relative to the phase of the driving signal.

6. The circuit according to claim 1, wherein the phase difference circuit comprises a multiplication circuit (63);
wherein the multiplication circuit has a first signal input node coupled to the source input node and a second input node coupled to the feedback generator; and
wherein the multiplication circuit is configured to provide a multiplication signal (mul) which is substantially equal to the product of the response signal and the feedback signal.

7. The circuit according to claim 6, wherein the multiplication circuit comprises either a chopper or a polarity-reversing switch (68).

8. The circuit according to claim 1, further comprising:
a first chopper (65), coupled to the phase difference circuit and to the integration circuit, configured to receive the error signal from the phase difference circuit and a chopping signal having a first chopping frequency (fch1), and configured to provide a chopped error signal (chm) to the integration circuit; a second chopper (66) coupled to the source input node, configured to receive the response signal and a chopping signal having a second chopping frequency (fch2), and configured to provide a chopped response signal to the source input node.

9. The circuit according to claim 1, wherein the electrothermal filter is configured to be driven by a heat power signal as the driving signal (sdr), the heat power signal having a frequency (fdr) equal to the driving signal.

10. The circuit according to claim 9, further comprising:
a first chopper (65), coupled to the phase difference circuit and to the integration circuit, configured to receive the error signal from the phase difference circuit and a chopping signal having a first chopping frequency (fch1), and configured to provide a chopped error signal (chm) to the integration circuit; a second chopper (66) coupled to an input node of the electrothermal filter, the second chopper configured to receive the driving signal (sdr) and a chopping signal having a second chopping frequency (fch2), and configured to provide a chopped driving signal (chdr) to the input node of the electrothermal filter (30).

11. The circuit according to claim 9, wherein a range of phases of the plurality of fixed phases extends over a phase angle corresponding to a desired temperature range corresponding to a relationship between the phase of the response signal and a temperature experienced by the electrothermal filter.

12. The circuit according to claim 1, further comprising: a first chopper (65), coupled to the phase difference circuit and to the integration circuit, configured to receive the error signal from the phase difference circuit and a chopping signal having a first chopping frequency (fch1), and configured to provide a chopped error signal (chm) to the integration circuit; a second chopper (66) coupled to an input node of the electrothermal filter, the second chopper configured to receive the driving signal (sdr) and a chopping signal having a second chopping frequency (fch2), and configured to provide a chopped driving signal (chdr) to the input node of the electrothermal filter (30).

13. The circuit according to claim 12, further comprising a polarity switching circuit (psc) an input of the second chopper (66) coupled to an output of the polarity switching circuit, the polarity switching circuit configured for:
receiving on an input the driving signal,
periodically inverting a polarity of a voltage or current of the received driving signal, and
outputting the periodically polarity inverted driving signal (sdr-inv) to the input of the second chopper.

14. The circuit according to claim 1 wherein the phase detection circuit comprises a polarity switching circuit, an input of the electrothermal filter coupled to an output of the polarity switching circuit, the polarity switching circuit configured for:
receiving on an input the driving signal,
periodically inverting a polarity of a voltage or current of the received driving signal, and
outputting the periodically polarity inverted driving signal to the input of the electrothermal filter.

15. The circuit according to claim 1, wherein a range of phases of the plurality of fixed phases extends over a phase angle corresponding to a desired temperature range corresponding to a relationship between the phase of the response signal and a temperature experienced by the electrothermal filter.

16. A method for phase detection in a circuit of an electrothermal filter coupled to a phase detection circuit according to claim 1, for determining a phase difference between the response signal (sv) of the electrothermal filter and the driving signal (sdr) of the electrothermal filter, the response signal and the driving signal having an equal frequency (f0,fdr); the method comprising:
receiving the response signal whose phase relationship with respect to the driving signal is to be determined;
subtracting the phases of the response signal (sv) and the feedback signal (pfb) to obtain the error signal (sum; mul; mulc; chm);
integrating the error signal as the integration signal (int); characterised by
digitizing the integration signal as the digitized integration signal;
generating the phase of the feedback signal based on the digitized integration signal, wherein the-phase of the feedback signal is selected from the plurality of fixed phases (ps1 . . . psn; p1, p2); and
subsequently, providing the feedback signal having the selected phase, for the subtraction of the phase of the response signal and the feedback signal to obtain the error signal.

\* \* \* \* \*